United States Patent [19]
Okazaki et al.

[11] Patent Number: 4,821,094
[45] Date of Patent: Apr. 11, 1989

[54] GATE ALIGNMENT PROCEDURE IN FABRICATING SEMICONDUCTOR DEVICES

[75] Inventors: Eldon Okazaki, Sunnyvale; Howard L. Petersen, Saratoga, both of Calif.

[73] Assignee: Lockheed Missiles & Space Company, Inc., Sunnyvale, Calif.

[21] Appl. No.: 45,738

[22] Filed: May 4, 1987

Related U.S. Application Data

[63] Continuation of Ser. No. 807,100, Nov. 8, 1985, abandoned.

[51] Int. Cl.⁴ .................. H01L 29/78; H01L 21/306; B44C 1/22; C23F 1/02
[52] U.S. Cl. ..................... 357/23.1; 156/653; 156/656; 156/657; 156/659.1; 357/41; 357/65; 430/317; 430/318; 437/41; 437/58; 437/203; 437/228
[58] Field of Search ............... 156/643, 644, 653, 656, 156/657, 659.1, 662; 430/313, 317, 318; 357/22, 23.1, 23.9, 41, 49, 65; 437/29, 34, 41, 57, 58, 62, 180, 203, 228, 235, 238, 245

[56] References Cited
U.S. PATENT DOCUMENTS 3,503,124 3/1970 Wanlass et al. .................. 29/577 X
3,997,367 12/1976 Yau .................................. 148/187 X
4,532,004 7/1985 Akiyama ......................... 156/662 X Primary Examiner—William A. Powell
Attorney, Agent, or Firm—John J. Morrissey

[57] ABSTRACT

A self-aligned metal gate is formed on a semiconductor substrate surface between a source region and a drain region of the substrate. Precise alignment of the boundaries of the gate with the boundaries of the source and drain regions is obtained by shadowing a photoresist coating over metal deposited onto the substrate surface, while photochemically dissociating the photoresist over metal deposited onto an oxide layer formed over the source and drain regions of the substrate. The developed photoresist is removed, and the undeveloped photoresist is hard-baked to serve as a protective coating for the metal between the source and drain regions. The metal over the source and drain regions is etched away, leaving the metal between the source and drain regions to function as an electronic gate.

11 Claims, 4 Drawing Sheets

FIG_1
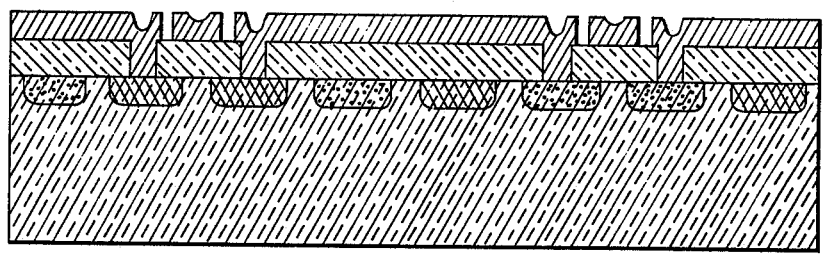
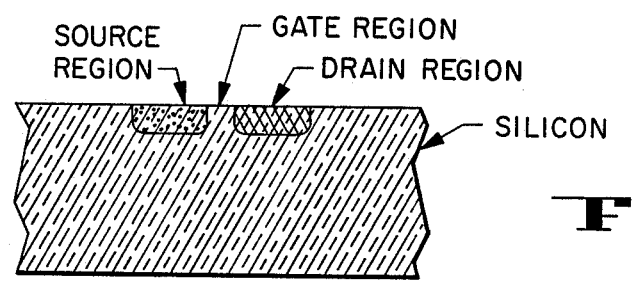
FIG_2
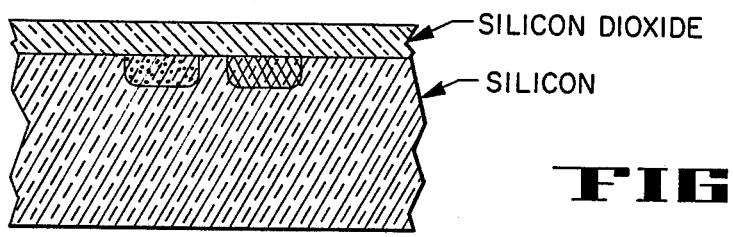
FIG_3
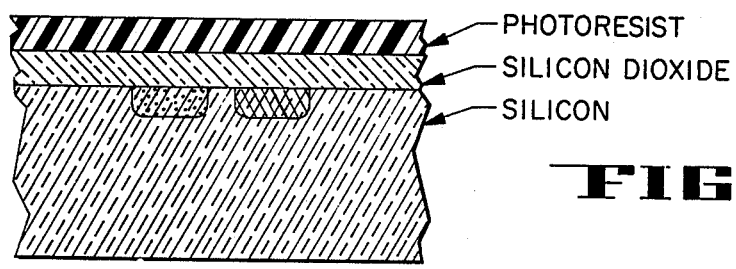
FIG_4

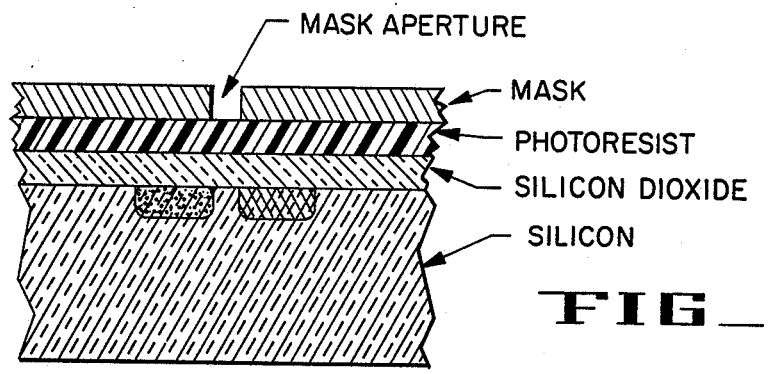
FIG_5
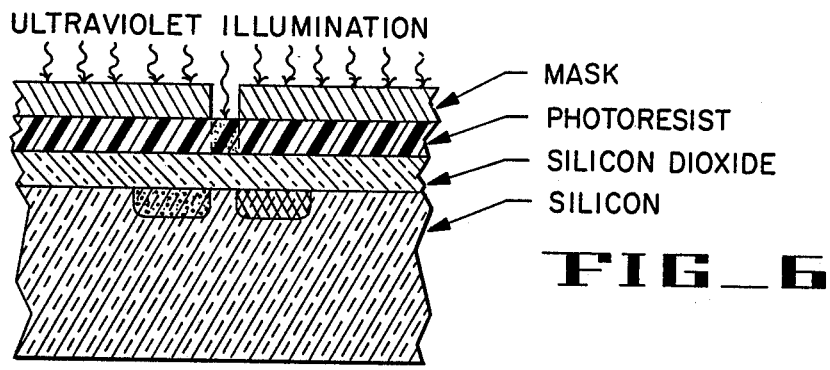
FIG_6
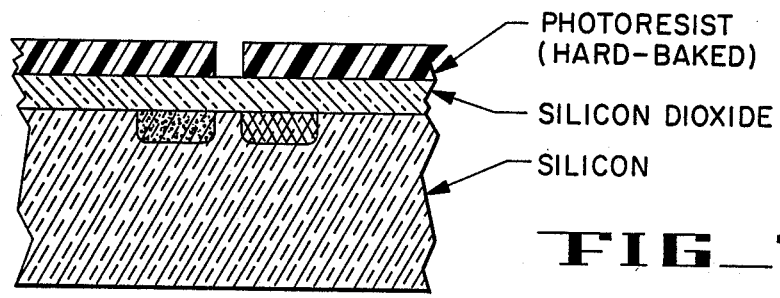
FIG_7
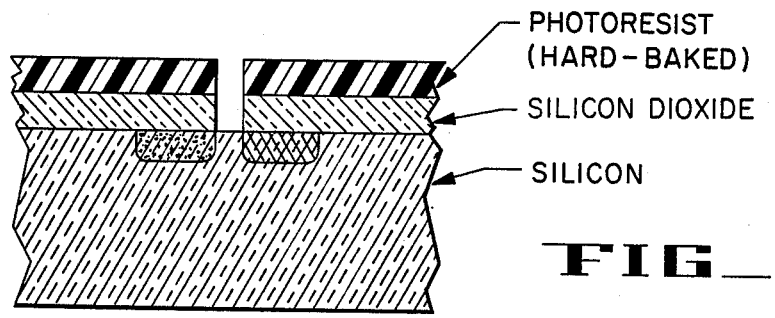
FIG_8

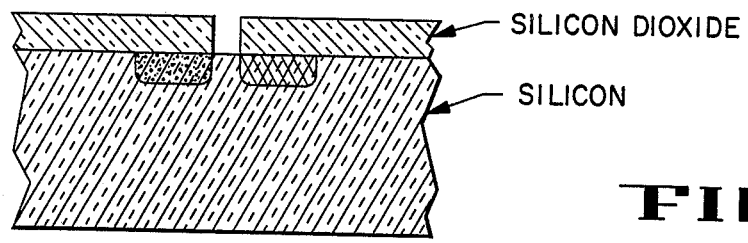
FIG_9
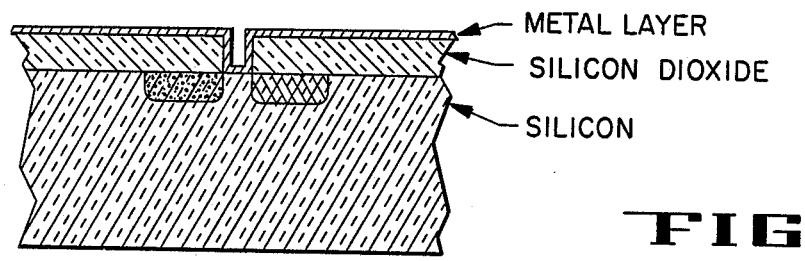
FIG_10
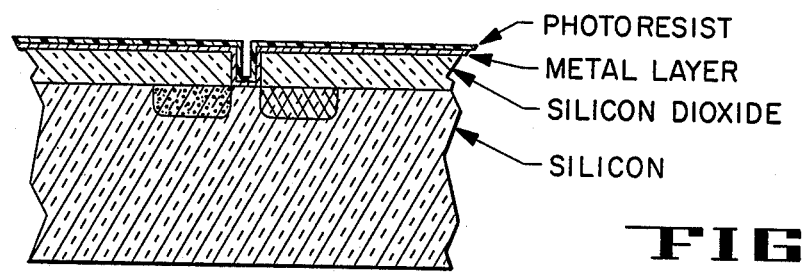
FIG_11
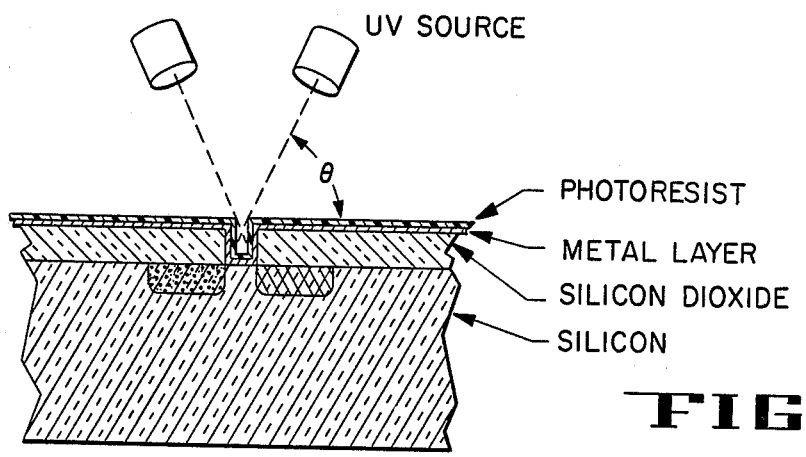
FIG_12

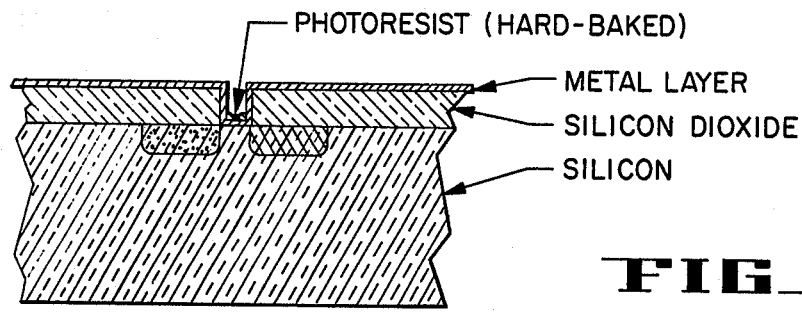
FIG_13
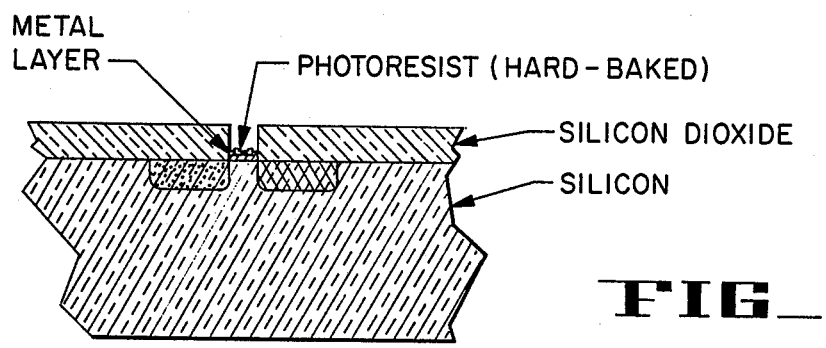
FIG_14
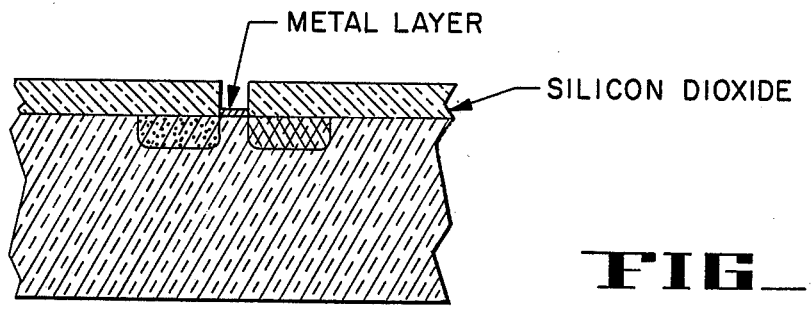
FIG_15

GATE ALIGNMENT PROCEDURE IN FABRICATING SEMICONDUCTOR DEVICES

The Government has rights in this invention pursuant to Contract F19628-81-C-0086 awarded by the Department of the Air Force.

This is a continuation of Ser. No. 807,100 filed on Nov. 8, 1985, now abandoned.

TECHNICAL FIELD

This invention pertains generally to the fabrication of semiconductor devices, and more particularly to a method for providing a self-aligned metal gate between a source region and a drain region on a semiconductor substrate.

BACKGROUND ART

To provide a metal gate between a source region and a drain region on a semiconductor substrate, it is conventional practice to deposit a layer of metal on a surface portion of the substrate over a region (called the gate region) between the source region and the drain region. It is generally advantageous for the boundaries of the metal gate to be aligned as precisely as possible with the boundaries of the source and drain regions of the substrate in order to minimize parasitic capacitances. A masking technique is normally used to define the boundaries of the metal gate with respect to the boundaries of the source and drain regions of the substrate.

Conventionally, in forming a metal gate on a surface portion of a semiconductor substrate, a mask is placed over the surface of the substrate. The mask has a pattern of dark fields and apertures, which are arranged according to the design of the particular integrated circuit being produced on the semiconductor device. The mask is positioned so that dark fields are aligned with the source and drain regions, and so that an aperture is aligned with the gate region. The metal that is to form the gate is deposited through the aperture directly onto the surface portion of the substrate over the gate region.

In the prior art, it was generally difficult to achieve precise alignment of the boundaries of a metal gate with the boundaries of closely spaced source and drain regions on a semiconductor substrate, particularly in fabricating JFET and MOS devices for which the spacing between adjacent source and drain regions is typically on the order of 1.2 microns. Ordinarily, the precision with which the boundaries or a metal gate could be aligned with the boundaries of source and drain regions on a semiconductor substrate decreased with decreasing separation between the source and drain regions. Furthermore, uniformity in the thickness and density of the gate metal also generally decreased with decreasing separation between the source and drain regions.

In the prior art, there has been a widely acknowledged need for a technique that would enable self-aligned metal gates to be formed on semiconductor devices, particularly on very high speed integrated circuits (VHSIC) and on devices requiring very large scale integration (VLSI).

SUMMARY OF THE INVENTION

The present invention provides a method for forming a metal gate between a source region and a drain region on a semiconductor substrate. The gate is formed by depositing a layer of metal on a surface portion of the substrate according to a procedure that results in self-alignment of the boundaries of the gate with the boundaries of the source and drain regions of the substrate.

To implement the method of the present invention in an application in which a self-aligned metal gate is to be formed on a surface portion of a semiconductor substrate over a gate region intervening between a source region and a drain region of the substrate, the following operations are performed in sequence:

(a) A continuous oxide layer of substantially uniform thickness is formed on the surface of the substrate over the source and drain regions and over the intervening gate region;

(b) A continuous layer of positive photoresist of substantially uniform thickness is coated over the oxide layer;

(c) A mask is positioned over the layer of positive photoresist so that dark fields of the mask are aligned with the source and drain regions, and so that an aperture on the mask is aligned with the gate region;

(d) The mask is exposed to ultraviolet light of a wavelength to which the photoresist is photochemically sensitive, whereby the portion of the photoresist layer that is unprotected by the dark fields of the mask (i.e., the portion of the photoresist layer under the aperture) becomes developed;

(e) The mask is removed, and the developed portion of the photoresist layer is washed away with a basic solution, thereby leaving undeveloped portions of the photoresist layer covering corresponding portions of the oxide layer over the source and drain regions, and thereby exposing the portion of the oxide layer that is aligned with the gate region;

(f) The undeveloped portions of the photoresist layer covering the portions of the oxide layer over the source and drain regions are hard-baked to form a protective covering;

(g) The exposed portion of the oxide layer aligned with the gate region is etched away to expose a surface portion of the substrate over the gate region, thereby leaving salient edges of the portions of the oxide layer (covered by the corresponding hard-baked portions of the photoresist layer) over the source and drain regions in alignment with corresponding boundaries of the gate region to define side-walls of a channel over the gate region;

(h) The hard-baked portions of the photoresist layer are stripped away from the corresponding portions of the oxide layer over the source and drain regions, thereby leaving the salient edges of the portions of the oxide layer over the source and drain regions on either side of the exposed surface portion of the substrate over the gate region;

(i) A continuous layer of metal of substantially uniform thickness is deposited (as by sputtering or vapor deposition) onto the portions of the oxide layer over the source and drain regions (including the salient edges thereof extending from the surface of the substrate), and onto the surface portion of the substrate in the channel over the gate region;

(j) A continuous layer of positive photoresist of substantially uniform thickness is coated over the metal layer;

(k) A collimated beam of ultraviolet light of a wavelength to which the positive photoresist is photochemically sensitive is directed at an oblique angle with respect to the surface of the substrate, whereby the portion of the photoresist layer that is coated over the portion of the metal layer in the channel over the gate region is shadowed by the salient edges of the portions of the oxide layer over the source and drain regions, thereby causing the portions of the photoresist layer coated over the portions of the metal layer on the portions of the oxide layer over the source and drain regions to become developed, but thereby preventing the portion of the photoresist layer that is coated over the portion of the metal layer in the channel over the gate region from being exposed to the ultraviolet light and hence from becoming developed;

(l) The developed portions of the photoresist layer are washed away with a basic solution, thereby exposing the portions of the metal layer on the portions of the oxide layer over the source and drain regions, but thereby leaving the undeveloped portion of the photoresist layer that is coated over the portion of the metal layer in the channel over the gate region;

(m) The undeveloped portion of the photoresist layer that is coated over the portion of the metal layer on the surface portion of the substrate in the channel over the gate region is hard-baked to form a protective covering;

(n) The portions of the metal layer on the portions of the oxide layer over the source and drain regions are etched away, thereby exposing the portions of the oxide layer over the source and drain regions while leaving the hard-baked portion of the photoresist layer over the portion of the metal layer on the surface portion of the substrate over the gate region;

(o) The hard-baked portion of the photoresist layer is stripped away from the portion of the metal layer on the surface portion of the substrate over the gate region, thereby leaving the portion of the metal layer on the surface portion of the substrate over the gate region to function as an electronic gate whose boundaries are thus self-aligned with the boundaries of the source and drain regions.

The boundaries of the portion of the metal layer remaining on the surface portion of the substrate over the gate region of the substrate after the above-listed sequential operations have been completed are precisely aligned with the corresponding boundaries of the source and drain regions of the substrate. This portion of the metal layer remaining on the surface portion of the substrate over the gate region functions as an electronic gate between the source region and the drain region of the substrate.

DESCRIPTION OF THE DRAWING

FIG. 1 is a cross-sectional view of a representative semiconductor device in which source regions and drain regions implanted in a silicon substrate are schematically illustrated.

FIG. 2 is a schematic cross-sectional view of adjacent source and drain regions separated by a gate region on a semiconductor substrate.

FIGS. 3–15 schematically illustrate consecutive steps according to the method of the present invention for forming a metal gate that is precisely aligned with the boundaries of the source and drain regions of the semiconductor substrate of FIG. 2.

BEST MODE OF CARRYING OUT THE INVENTION

A semiconductor device typically comprises a substrate of pure silicon having a thickness of about 14 to 16 mils. In FIG. 1, a typical semiconductor device of the NMOS type is schematically illustrated to show a silicon substrate having a crystal lattice that is doped, as by ion implantation or diffusion, to form source regions (i.e., regions characterized by a concentration of electron-donor impurities) and drain regions (i.e., regions characterized by a concentration of electron-acceptor impurities). Each source region and adjacent drain region of such a semiconductor device are separated from each other by a gate region, which is typically about 0.5 to 1.0 micron in transverse dimension. In VLSI devices, the spacing between adjacent source and drain regions (i.e., the transverse dimension of the gate region) is typically about 0.75 micron. Electrical contacts are secured by conventional techniques to surface portions of the semiconductor substrate over the source regions, the drain regions and the intervening gate regions. Biasing voltages can be applied to these electrical contacts to cause the semiconductor device to function as an electronic switch.

A schematic view of adjacent source and drain regions separated by a gate region on a semiconductor substrate is provided in FIG. 2 in which the stippled area represents the source region and the cross-hatched area represents the drain region. As shown in FIG. 2, the surface of the semiconductor substrate is substantially isoplanar (i.e., has a continuous planar surface) over the source region, the drain region and the intervening gate region. Formation of a metal gate on the surface of the substrate over the gate region for controlling electrical conductivity between the source region and the drain region of the semiconductor device is accomplished according to the present invention by sequentially performing the steps illustrated in FIGS. 3–15.

The first step, as illustrated in FIG. 3, is to form a continuous oxide layer (i.e., a continuous layer of silicon dioxide $SiO_2$) of substantially uniform thickness on the surface of the silicon substrate. The $SiO_2$ layer covers the source region, the drain region and the intervening gate region of the substrate. In fabricating a junction field effect transistor (JFET), the oxide layer would typically be formed as a "plasma oxide" by plasma deposition. For other types of semiconductor devices, the oxide layer could be formed as a "thermal oxide", which is typically produced by heating the substrate in an oxygen or steam environment at about 1100° C. for about two hours.

Next, as illustrated in FIG. 4, a continuous layer of positive photoresist, such as AZ-4210 marketed by American Hoechst Corporation, is coated over the oxide layer. The photoresist is a diazo polymer, whose chemical bonds dissociate upon exposure to ultraviolet light in a wavelength band from 300 to 450 nanometers. The photoresist may be coated onto the oxide layer by a conventional process, such as the well-known "wafer trac" technique or a manual "spin-on" technique.

Then, as illustrated in FIG. 5, a mask is positioned over the layer of positive photoresist. The mask typically comprises contiguous regions of chrome and quartz arranged in a pattern of dark fields and apertures as required by the particular design of the integrated circuit that is to be formed on the substrate. As shown in FIG. 5, an aperture on the mask is aligned with the gate region of the substrate, and dark fields of the mask cover the source and drain regions of the substrate. Alignment of the mask aperture and dark fields with the corresponding gate region and source and drain regions of the substrate is conventionally accomplished by providing alignment marks on the substrate.

Next, as illustrated in FIG. 6, the mask is illuminated with ultraviolet light, which causes the photoresist to undergo photochemical dissociation (also called "development"). The portions of the photoresist layer covered by the dark fields of the mask are shielded from the ultraviolet light, and hence do not become photochemically dissociated (or "developed"). However, the portion of the photoresist layer exposed to the ultraviolet light by the aperture on the mask (i.e., the portion of the photoresist layer aligned with the gate region of the substrate) does undergo development. The developed portion of the photoresist layer, which is indicated by FIG. 6 by stippling, is soluble in a basic solution such as ammonium hydroxide.

As indicated in FIG. 7, the next step in forming the gate is to remove the mask and to wash away the developed portion of the photoresist layer. The portion of the oxide layer over the gate region of the substrate is thereby exposed, while the undeveloped portions of the photoresist layer remain covering the portions of the oxide layer over the source and drain regions of the substrate. Then, the undeveloped portions of the photoresist layer are hard-baked (typically at about 120° C. for about 0.5 hour) to form a rugged protective coating over the portions of the oxide layer over the source and drain regions of the substrate.

Next, as illustrated in FIG. 8, the exposed portion of the oxide layer (i.e., the portion of the oxide layer aligned with the gate region of the substrate) is etched away by a buffered oxide etch (BOE), such as a solution of one part hydrofluoric acid (HF) and 10 parts ammonium fluoride ($NH_4F$). This etching process exposes the surface portion of the substrate over the gate region, and leaves salient edges of the portions of the oxide layer over the source and drain regions of the substrate. These salient edges are aligned with corresponding boundaries of the gate region, and define side-walls of a channel over the gate region of the substrate.

Then, as indicated in FIG. 9, the hard-baked portions of the photoresist layer protecting the portions of the oxide layer over the source and drain regions of the substrate are removed. Conventionally, the hard-baked photoresist could be stripped away by exposure to an oxygen plasma, or could be dissolved by application of Nophenol 922. The portions of the oxide layer remaining over the source and drain regions of the substrate after the hard-baked portions of the photoresist layer have been removed are raised like steps above the surface of the substrate. The vertical edge of each step (i.e., the salient edge which defines the thickness of the oxide layer and functions as a side-wall of the channel over the gate region) is typically about 1.0 micron.

Then, as illustrated in FIG. 10, a continuous layer of metal such as tungsten or aluminum alloy is deposited at a substantially uniform thickness onto the steps (i.e., onto the raised portions of the oxide layer) over the source and drain regions, including the vertical edges of those steps, and onto the surface portion of the substrate in the channel over the gate region. This layer of metal may be deposited by a conventional technique, such as sputtering or vapor deposition.

Next, as illustrated in FIG. 11, a continuous layer of positive photoresist, which is preferably the same photoresist material as was used for the operation illustrated in FIG. 4, is coated over the layer of metal. The photoresist layer, which is of substantially uniform thickness, covers the horizontal and vertical surface areas of the portions of the metal layer deposited onto the step-like portions of the oxide layer, and also covers the horizontal surface area of the portion of the metal layer at the bottom of the channel over the gate region of the substrate.

A collimated beam of ultraviolet light is then directed, as illustrated schematically in FIG. 12, at an oblique angle toward the substrate. The portions of the photoresist layer that cover:
(a) the horizontal surface area of the portions of the metal layer on the step-like portions of the oxide layer, and
(b) the vertical surface area of the portions of the metal layer on the upper parts of the vertical edges of the step-like portions of the oxide layer on opposite sides of the channel, are photochemically dissociated by the ultraviolet light. However, because of the oblique angle of incidence of the collimated ultraviolet light beam, the portions of the photoresist layer that cover:
(a) the vertical surface area of the portions of the metal layer on the lower parts of the vertical edges of the step-like portions of the oxide layer on opposite sides of the channel, and
(b) the horizontal surface area of the portion of the metal layer on the surface of the substrate over the gate region at the bottom of the channel, are effectively shadowed from the ultraviolet light, and therefore do not undergo photochemical dissociation. The value of the angle of incidence $\theta$ of the collimated beam upon the photoresist layer (as indicated in FIG. 12) is not critical, but must be small enough so that the shadowing effect caused by the salient edges of the step-like portions of the oxide layer effectively shields the entire horizontal surface area of the portion of the photoresist layer covering the portion of the metal layer at the bottom of the channel from exposure to the ultraviolet light. In this way, the portion of the photoresist layer that remains undeveloped is self-aligned with the gate region of the substrate.

Next, as indicated in FIG. 13, the developed portions of the photoresist layer, which are aligned with the source and drain regions of the substrate, are dissolved and washed away by a basic solution such as AZ-400K marketed by American Hoechst Corporation. The portions of the metal layer covering the step-like portions of the oxide layer over the source and drain regions of the substrate are thereby exposed. However, an undeveloped portion of the photoresist layer remains as a covering over the portion of the metal layer in the channel over the gate region. This undeveloped portion of the photoresist layer is then hard-baked to form a durable protective covering over the portion of the metal layer in the channel.

Then, as indicated in FIG. 14, the exposed portions of the metal layer over the step-like portions of the oxide layer (including the portions of the metal layer on the upper parts of the vertical edges of the step-like portions of the oxide layer) are etched away by a conventional technique, such as by application of phosphoric acid in the case of aluminum, or by exposure to a carbon fluoride plasma in the case of tungsten. In this way, the step-like portions of the oxide layer over the source and drain regions of the substrate are exposed. The etching procedure is stopped in time to leave portions of the metal layer on the lower parts of the vertical edges of the step-like portions of the oxide layer at the boundries of the gate region.

Next, as illustrated in FIG. 15, the hard-baked photoresist over the gate region of the substrate is stripped away or dissolved, thereby leaving the remaining portion of the metal layer to function as an electronic gate between the source region and the drain region. The semiconductor substrate with the metal gate formed on the surface thereof between the source region and the drain region, as illustrated in FIG. 15, can now be further processed according to conventional techniques or otherwise to produce an integrated circuit.

A description has been provided herein of a method for forming a metal gate between a source region and a drain region on a semiconductor substrate. The description has referred specifically to the fabrication of particular types of semiconductor devices. However, a practitioner in the art of fabricating semiconductor devices, upon perusing the foregoing description and the accompanying drawing, would be able to devise other applications for the present invention. Accordingly, the foregoing description and the accompanying drawing are to be understood as being illustrative of the invention, which is defined by the following claims and their equivalents.

We claim:

1. A method of depositing a material onto a first surface portion of a semiconductor substrate, said method providing precise alignment of said material with a boundary of said first surface portion of said substrate, said method comprising the sequential steps of:
   (a) forming a protective layer over said substrate, a first portion of said protective layer covering said first surface portion of said substrate and a second portion of said protective layer covering a second surface portion of said substrate, said second surface portion of said substrate being contiguous with said first surface portion of said substrate at said boundary;
   (b) removing said first portion of said protective layer, thereby exposing said first surface portion of said substrate, and thereby forming a salient edge of said second portion of said protective layer at said boundary;
   (c) depositing a continuous layer of said material onto said first surface portion of said substrate, and onto said second portion of said protective layer covering said second surface portion of said substrate;
   (d) covering said continuous layer of said material with a photochemically dissociable coating;
   (e) directing a collimated beam of optical radiation at an oblique angle with respect to said first surface portion of said substrate, said radiation having a wavelength that causes photochemical dissociation of said dissociable coating, said oblique angle having a value such that said salient edge of said second portion of said protective layer causes a shadow to be cast upon a first portion of said dissociable coating covering a first portion of said continuous layer of said material on said first surface portion of said substrate adjacent said boundary, said radiation photochemically dissociating a second portion of said dissociable coating covering a second portion of said continuous layer of said material on said second portion of said protective layer covering said second surface portion of said substrate, said shadow preventing said first portion of said dissociable coating from being exposed to said radiation;
   (f) removing said second portion of said dissociable coating after dissociation thereof by said radiation, thereby leaving said first portion of said dissociable coating covering said first portion of said continuous layer of said material on said first surface portion of said substrate; and
   (g) removing said second portion of said continuous layer of said material from said second portion of said protective layer covering said second surface portion of said substrate.

2. The method of claim 1 comprising the further step of removing said first portion of said dissociable coating from said first portion of said continuous layer of said material on said first surface portion of said substrate.

3. The method of claim 1 wherein said protective layer over said substrate is formed by oxidizing said first and second surface portions of said substrate to form a continuous oxide layer, a first portion of said oxide layer covering said first surface portion of said substrate and a second portion of said oxide layer covering said second surface portion of said substrate.

4. The method of claim 3 wherein said first portion of said protective layer is removed by the sequential steps of:
   (a) coating said oxide layer with a photochemically dissociable layer;
   (b) positioning an apertured mask over said dissociable layer so that an aperture on said mask is over a first portion of said dissociable layer in alignment with said first portion of said oxide layer at said boundary, and so that a dark field of said mask covers a second portion of said dissociable layer in alignment with said second portion of said oxide layer at said boundary;
   (c) illuminating said mask with optical radiation of a wavelength that causes photochemical dissociation of said dissociable layer, said dark field of said mask preventing exposure of said second portion of said dissociable layer to said radiation, said aperture on said mask exposing said first portion of said dissociable layer to said radiation, said first portion of said dissociable layer thereby becoming photochemically dissociated;
   (d) removing said mask, and removing said first portion of said dissociable layer after dissociation thereof from said first portion of said oxide layer, thereby exposing said first portion of said oxide layer while leaving said second portion of said dissociable layer on said second portion of said oxide layer;
   (e) treating said second portion of said dissociable layer to form a protective covering over said second portion of said oxide layer; and
   (f) etching away said first portion of said oxide layer to expose said first surface portion of said substrate.

5. The method of claim 3 wherein said substrate is made of silicon, and wherein said oxide layer is formed by exposing said substrate to an environment favorable to oxidation of silicon.

6. The method of claim 4 wherein said photochemically dissociable layer is a diazo polymer whose chemical bonds dissociate upon exposure to ultraviolet light, and wherein said radiation is ultraviolet light.

7. The method of claim 6 wherein said second portion of said dissociable layer is treated by baking said diazo polymer to form said protective covering.

8. The method of claim 1 wherein said second surface portion of said substrate comprises separated source and drain regions on said substrate, and wherein said first surface portion of said substrate comprises a gate region intervening between said source and drain regions, said layer of coating material on said first surface portion of said substrate being a metal gate between said source region and said drain region.

9. A method of providing a metal gate on a semiconductor substrate surface between a source region and a drain region of the substrate, said method comprising the sequential steps of:
   (a) forming a continuous oxide layer on said substrate surface over said source and drain regions and over a gate region intervening between said source and drain regions;
   (b) coating a continuous layer of photoresist over said oxide layer;
   (c) positioning a mask over said layer of photoresist so that dark fields of said mask are aligned with said source and drain regions, and so that an aperture on said mask is aligned with said gate region;
   (d) exposing said mask to light of a wavelength to which said photoresist is photochemically sensitive, a portion of said layer of photoresist aligned with said gate region thereby becoming developed;
   (e) removing said mask;
   (f) removing said developed portion of said layer of photoresist, thereby exposing a portion of said oxide layer over said gate region while leaving undeveloped portions of said layer of photoresist on portions of said oxide layer over said source and drain regions;
   (g) treating said undeveloped portions of said layer of photoresist to form a protective covering over said portions of said oxide layer over said source and drain regions;
   (h) etching away said exposed portion of said oxide layer over said gate region, thereby exposing a surface portion of said substrate over said gate region while leaving edges of said portions of said oxide layer in alignment with boundaries of said gate region;
   (i) stripping away said protective covering over said portions of said oxide layer over said source and drain regions;
   (j) depositing a continuous layer of metal onto said portions of said oxide layer over said source and drain regions, including said edges of said portions of said oxide layer in alignment with said boundaries of said gate region, and onto said exposed surface portion of said substrate over said gate region;
   (k) coating a continuous layer of photoresist over said layer of metal;
   (l) directing a collimated beam of light of a wavelength to which said photoresist is photochemically sensitive at an oblique angle with respect to said substrate surface, said collimated beam of light causing portions of said photoresist layer aligned with said source and drain regions to become developed, said oblique angle having a value such that at least one of said edges of said portions of said oxide layer in alignment with said boundaries of said gate region causes a shadow to be cast upon a portion of said layer of photoresist on a portion of said layer of metal on said surface portion of said substrate over said gate region, said shadow preventing said portion of said layer of photoresist on said portion of said layer of metal on said surface portion of said substrate over said gate region from becoming developed;
   (m) removing said developed portions of said layer of photoresist aligned with said source and drain regions, thereby exposing portions of said layer of metal on said portions of said oxide layer over said source and drain regions while leaving an undeveloped portion of said layer of photoresist on said portion of said layer of metal on said surface portion of said substrate over said gate region;
   (n) treating said undeveloped portion of said photoresist layer to form a protective covering over said portion of said layer of metal on said surface portion of said substrate over said gate region; and
   (o) etching said portions of said layer of metal on said portions of said oxide layer over said source and drain regions.

10. The method of claim 9 comprising the further step of stripping away said protective covering over said portion of said layer of metal on said surface portion of said substrate over said gate region.

11. An electronic device comprising a semiconductor substrate having a source region and a drain region, said source and drain regions being separated from each other by a substantially homogeneous gate region, a surface of said substrate being substantially isoplanar over said source, drain and gate regions, an abrupt transition occurring within said substrate between said source region and said gate region and between said drain region and said gate region, said device further comprising a metal gate formed on a portion of said surface of said substrate over said gate region between said source region and said drain region, a first boundary of said metal gate being precisely aligned with a boundary of said source region on said portion of said surface of said substrate at said abrupt transition between said source region and said gate region, a second boundary of said metal gate being precisely aligned with a boundary of said drain region on said portion of said surface of said substrate at said abrupt transition between said drain region and said gate region, precise alignment of said first boundary of said metal gate with said boundary of said source region and of said second boundary of said metal gate with said boundary of said drain region substantially eliminating parasitic capacitances between said source region and said metal gate and between said drain region and said metal gate, said metal gate being formed on said portion of said surface of said substrate over said gate region without overlapping said source region and said drain region, said metal gate formed by the process of:
   (a) forming a continuous oxide layer on said isoplanar substrate surface over said source and drain regions and over said gate region intervening between said source and drain region;
   (b) coating a continuous layer of photoresist over said oxide layer;
   (c) positioning a mask over said layer of photoresist so that dark fields of said mask are aligned with said source and drain regions, and so that an aperture on said mask is aligned with said gate region;
   (d) exposing said mask to light of a wavelength to which said photoresist is photochemically sensitive, a portion of said layer of photoresist aligned with said gate region thereby becoming developed;
   (e) removing said mask;
   (f) removing said developed portion of said layer of photoresist, thereby exposing a portion of said oxide layer over said gate region while leaving undeveloped portions of said layer of photoresist on portions of said oxide layer over said source and drain regions;
(g) treating said undeveloped portions of said layer of photoresist to form a protective covering over said portions of said oxide layer over said source and drain regions;
(h) etching away said exposed portion of said oxide layer over said gate region, thereby exposing said portion of said surface of said substrate over said gate region while leaving edges of said portions of said oxide layer in alignment with boundaries of said gate region;
(i) stripping away said protective covering over said portions of said oxide layer over said source and drain regions;
(j) depositing a continuous layer of metal onto said portions of said oxide layer over said source and drain regions, including said edges of said portions of said oxide layer in alignment with said boundaries of said gate region, and onto said exposed portion of said surface of said substrate over said gate region;
(k) coating a continuous layer of photoresist over said layer of metal;
(l) directing a collimated beam of light of a wavelength to which said photoresist is photochemically sensitive at an oblique angle with respect to said isoplanar substrate surface, said collimated beam of light causing portions of said photoresist layer aligned with said source and drain regions to become developed, said oblique angle having a value such that at least one of said edges of said portions of said oxide layer in alignment with said boundaries of said gate region causes a shadow to be cast upon a portion of said layer of photoresist on a portion of said layer of metal on said portion of said surface of said substrate over said gate region, said shadow preventing said portion of said layer of photoresist on said portion of said layer of metal on said portion of said surface of said substrate over said gate region from becoming developed;
(m) removing said developed portions of said layer of photoresist aligned with said source and drain regions, thereby exposing portions of said layer of metal on said portions of said oxide layer over said source and drain regions while leaving an undeveloped portion of said layer of photoresist on said portion of said layer of metal on said portion of said surface of said substrate over said gate region;
(n) treating said undeveloped portion of said photoresist layer to form a protective covering over said portion of said layer of metal on said portion of said surface of said substrate over said gate region; and
(o) etching said portions of said layer of metal on said portions of said oxide layer over said source and drain regions.

* * * * *